(12) United States Patent
Lin et al.

(10) Patent No.: US 10,691,255 B1
(45) Date of Patent: Jun. 23, 2020

(54) FREQUENCY SELECTIVE CHARGE AMPLIFIER TO ATTENUATE COMMON MODE INTERFERERS

(71) Applicant: Avago Technologies International Sales Pte. Limited, Singapore (SG)

(72) Inventors: Fang Lin, Cupertino, CA (US); Tom W. Kwan, Cupertino, CA (US); Feng Su, San Jose, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 3 days.

(21) Appl. No.: 16/255,529

(22) Filed: Jan. 23, 2019

(51) Int. Cl.
  *G06F 3/041* (2006.01)
  *H03F 3/45* (2006.01)
  *G06F 3/044* (2006.01)

(52) U.S. Cl.
  CPC ............ *G06F 3/0416* (2013.01); *G06F 3/044* (2013.01); *H03F 3/45475* (2013.01); *G06F 2203/04104* (2013.01); *H03F 2200/129* (2013.01); *H03F 2200/144* (2013.01); *H03F 2203/45512* (2013.01); *H03F 2203/45526* (2013.01); *H03F 2203/45528* (2013.01); *H03F 2203/45544* (2013.01)

(58) Field of Classification Search
  CPC ............... G06F 3/0416; G06F 3/044; G06F 2203/04104; H03F 3/45475; H03F 2200/129; H03F 2200/144; H03F 2203/45512; H03F 2203/45526; H03F 2203/45528; H03F 2203/45544
  See application file for complete search history.

(56) References Cited

U.S. PATENT DOCUMENTS

2013/0176269 A1* 7/2013 Sobel ................... G06F 3/044
  345/174

* cited by examiner

*Primary Examiner* — Lisa S Landis
(74) *Attorney, Agent, or Firm* — Xsensus LLP

(57) ABSTRACT

Frequency selective analog front-end circuitry, used to convert a sensed charge signal to an analog voltage is disclosed. In one aspect, the frequency selective analog front-end circuitry includes an op-amp having an output, an inverting input and a noninverting input, a first resistor connected between the terminal of the first capacitor and the inverting input of the op-amp, a second capacitor connected between the output of the op-amp and the inverting input of the op-amp, a second resistor connected between the output of the op-amp and the inverting input of the op-amp, a third capacitor connected between the terminal of the first capacitor and the noninverting input of the op-amp, and a third resistor connected between the noninverting input of the op-amp and a reference voltage.

20 Claims, 4 Drawing Sheets

FREQUENCY SELECTIVE CHARGE AMPLIFIER TO ATTENUATE COMMON MODE INTERFERERS

BACKGROUND

Field

This disclosure relates to the field of touchscreen and touchpad systems, devices, components and methods.

Description of the Related Art

Capacitive touchscreen interfaces are used in a wide array of modern electronic devices, including smartphones, tablet computers, laptop and desktop computers, navigation units, and industrial controls. To provide reliable and consistent performance, touch controllers must contend with various types of noise and interference encountered in environments where capacitive touchscreens are employed. Noise and interference sources include, but are not limited to, displays (LCD, OLED, etc.), power supplies, wireless transmitters, and environmental/ambient noise.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
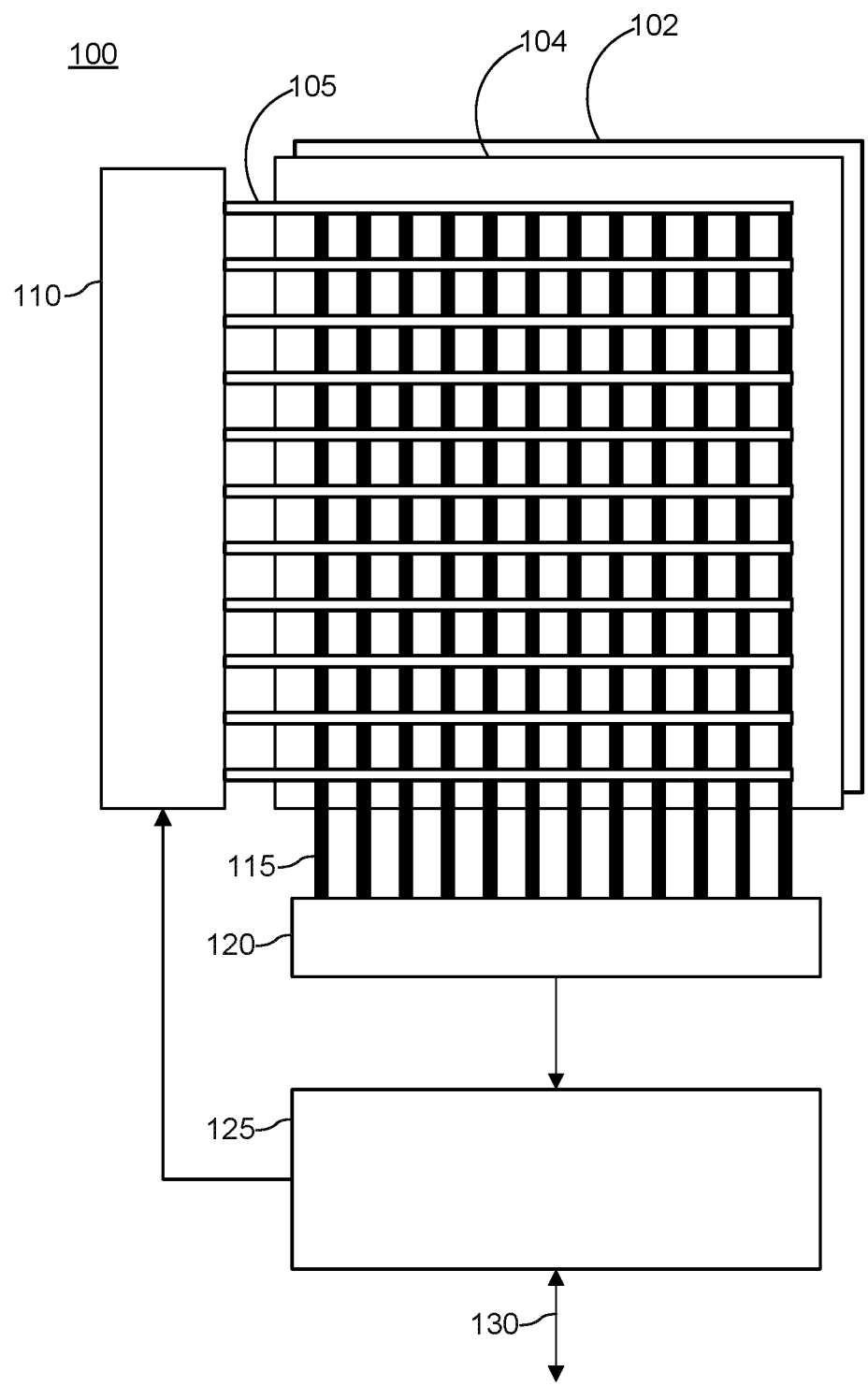
FIG. 1 illustrates a simplified capacitive touchscreen system according to some embodiments of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in simplified form in order to avoid obscuring the concepts of the subject technology.

Referring now to the drawings, wherein like reference numerals designate identical or corresponding parts throughout the several views, exemplary aspects of the disclosure include a touch controller charge amplifier with high common mode rejection that maintains high SNR performance, low power and small chip area.

FIG. 1 illustrates a simplified capacitive touchscreen system 100 according to some embodiments of the present disclosure. In some embodiments, capacitive touchscreen system 100 may include an underlying display 102 (LCD, OLED, etc.), a dielectric plate 104, a group of electrically conductive drive electrodes 105 disposed over (under) the dielectric plate 104, drive circuitry 110 connected to the group of drive electrodes 105, a group of electrically conductive sense electrodes 115 disposed under (over) the dielectric plate 104 and at an angle with respect to the drive electrodes 105, sense circuitry 120 connected to the group of sense electrodes 115, and controller 125 connected to the drive circuitry 110 and sense circuitry 120. In some embodiments, controller 125, drive circuitry 110 and sense circuitry 120 may be integrated on a single application-specific integrated circuit (ASIC) or incorporated as part of a larger system on a chip (SOC) for a particular device (for example, a smartphone, tablet computer, laptop or desktop computer, navigation unit, or industrial controller). In some embodiments, the angle between the drive electrodes 105 and the sense electrodes 115 may be approximately 90°. In other embodiments, the angle between the drive electrodes 105 and the sense electrodes 115 may be between 10° and 90°. In some embodiments (for example, a touchpad for a laptop or desktop computer), there may be no underlying display.

Drive electrodes 105 and sense electrodes 115 may be formed by applying (by physical vapor deposition, for example) a transparent conductive material, such as Indium Tin Oxide (ITO), to the surface(s) of dielectric plate 104, which may comprise glass, plastic or other suitable electrically insulating and optically transparent material. The capacitance at the intersection of each drive electrode 105 and sense electrode 115 may be measured by coordinating the activities of the controller 125, drive circuitry 110 and sense circuitry 120. Touching the panel with a finger or appropriate stylus may cause a measurable change in the capacitance at the intersection(s) nearest the point of contact. Controller 125 may analyze the coordinates of these changes in capacitance and provide this information to a processor or other system controller (not shown) through interface 130.

During operation, controller 125 may cause drive circuitry 110 to apply an AC excitation signal, such as a sine wave, square wave, meander signal or other suitable type of drive signal, which may have a fundamental frequency ($f_d$), as of this writing, in a range from about 20 kHz to about 500 kHz, to the drive electrodes 105. Higher frequency drive signals, in the range of 1 Mhz and above, may be used in various applications today and in the future. The AC excitation signal may couple to the sense electrodes 115 via mutual capacitance, and thereby, in the form of a charge signal, to sense circuitry 120.

Figure 2A:
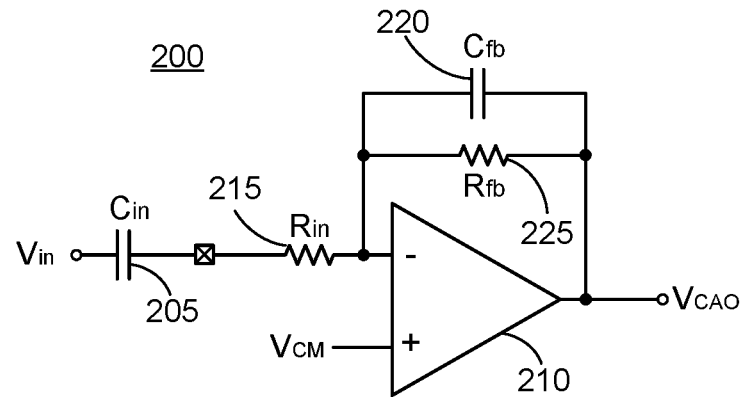
FIG. 2A illustrates a prior art single-ended charge amplifier.
Figure 2B:
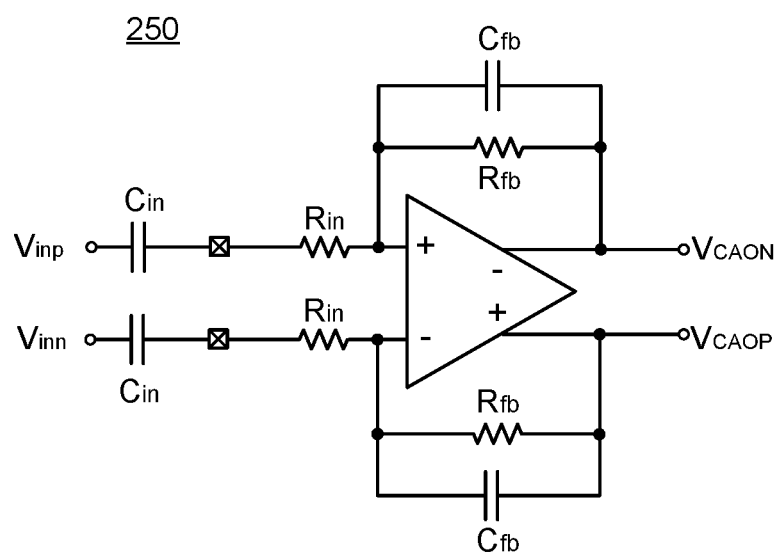
FIG. 2B illustrates a prior art differential charge amplifier.

FIGS. 2A and 2B illustrate conventional analog front-end circuitry used to convert the sensed charge signal on one of the sense electrodes 115 to an analog voltage. FIG. 2A illustrates a single-ended charge amplifier 200 (charge-to-voltage converter). In FIG. 2A, $C_{in}$ 205 represents the capacitance at the intersection of an associated sense electrode 115 and a driven drive electrode 105. Operational amplifier (Op-amp) 210, $R_{in}$ 215, $C_{fb}$ 220, and $R_{fb}$ 225 form a charge amplifier to convert the charge on $C_{in}$ 205 to an analog voltage $V_{CAO}$ at the output of Op-amp 210. The noninverting input of Op-amp 210 is connected to a reference voltage ($V_{CM}$). Strong common-mode interferers may tend to saturate a conventional single-ended charge amplifier such as that illustrated in FIG. 2A. Reducing the charge amplifier gain (by reducing $R_{fb}$ 225, for example) to avoid saturation may cause degradation in the signal-to-noise ratio (SNR). To maintain SNR performance, circuit power and chip area (component size) would typically need to be increased dramatically.

FIG. 2B illustrates a differential charge amplifier 250, which may help reduce the effect of common-mode interference. But the differential charge amplifier 250 would also remove the DC component of the sensed touch signals— only the difference between touch signals of two pixels connecting to the differential charge amplifier is measured. This creates additional complexity and SNR may still be degraded to reconstruct touch signals from difference measurements.

Figure 3:
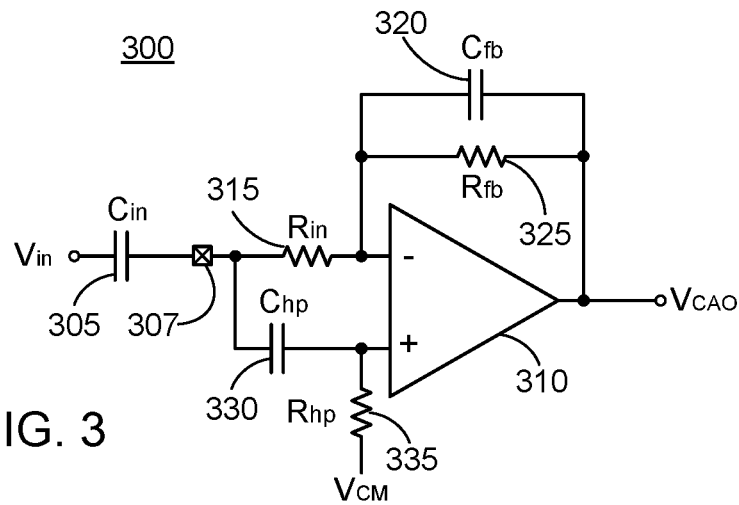
FIG. 3 illustrates a frequency selective analog front-end circuitry according to an embodiment of the present disclosure.

FIG. 3 illustrates a frequency selective analog front-end circuitry 300 used to convert the sensed charge signal on one of the sense electrodes 115 to an analog voltage according to an embodiment of the present disclosure. In FIG. 3, $C_{in}$ 305 represents the capacitance at the intersection of an associated sense electrode 115 and a driven drive electrode 105. Op-amp 310, $R_{in}$ 315, $C_{fb}$ 320, and $R_{fb}$ 325 form a charge amplifier to convert the charge on $C_{in}$ 305 (as measured at terminal 307) to an analog voltage $V_{CAO}$ at the output of Op-amp 310. $C_{hp}$, connected between $C_{in}$ 305 and the noninverting input of Op-amp 310, and $R_{hp}$, connected between the noninverting input of Op-amp 310 and reference voltage $V_{CM}$, create a pair of complex poles to boost the received charge signal to the charge amplifier and reduce common-mode interference harmonics. The values of $C_{hp}$ and $R_{hp}$ may be selected to attenuate common-mode interference above the frequencies used for the capacitive touchscreen system 100 (FIG. 1). In some embodiments, component values of the frequency selective analog front-end circuitry 300 may be selected to attenuate common-mode interference above the drive frequency $f_d$. For example, in some embodiments, the center frequency $\omega_0$ of the frequency selective analog front-end circuitry 300 may be selected to be in the range of 1 to 4 times the drive frequency $f_d$. Additionally, the frequency selectivity (the Q or "Quality" factor) of the frequency selective analog front-end circuitry 300 may be selected to be in the range of approximately 0.4 to 2.0.

Figure 4:
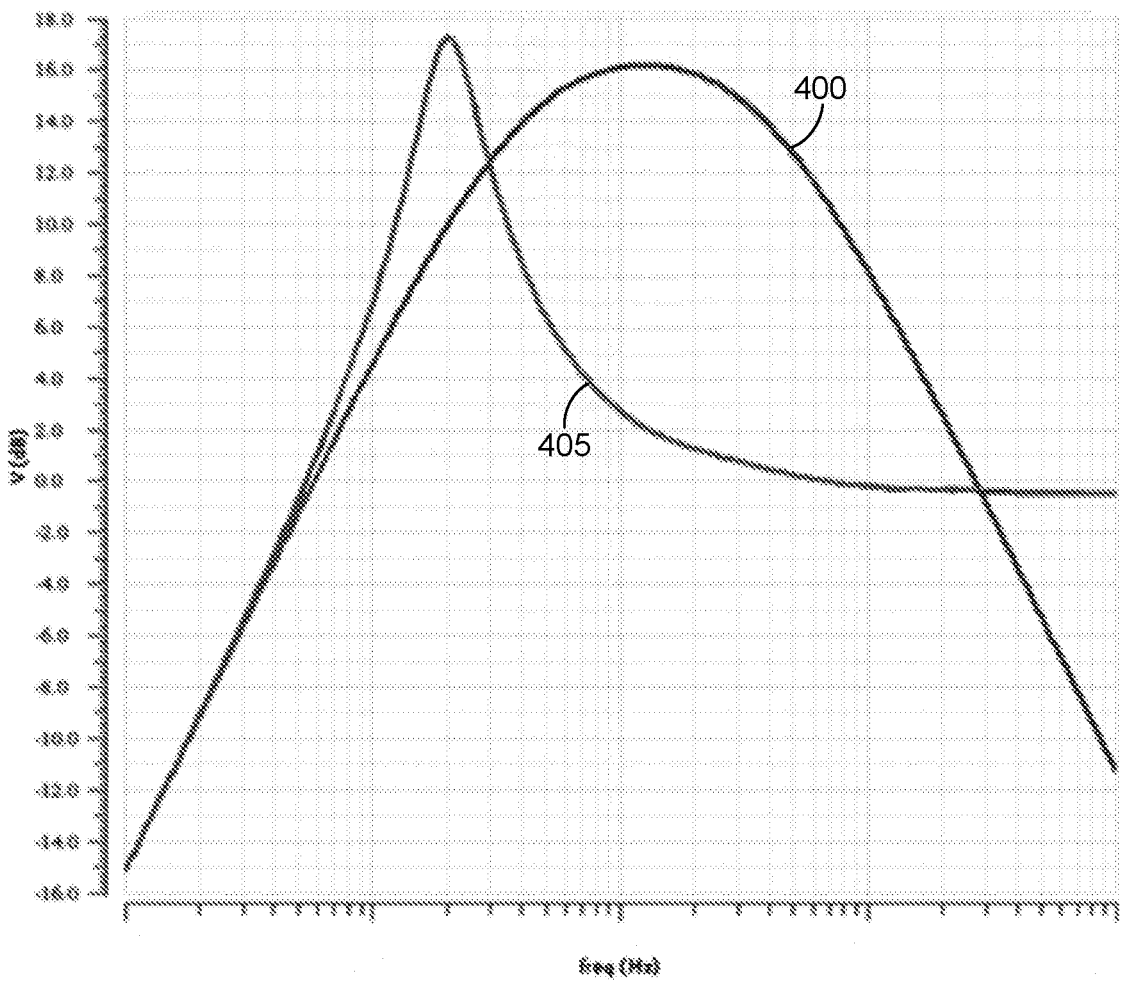
FIG. 4 illustrates the frequency response of the frequency selective analog front-end circuitry, according to some embodiments of the present disclosure.

FIG. 4 illustrates the frequency response of the frequency selective analog front-end circuitry 300 (FIG. 3), according to some embodiments of the present disclosure. Unfiltered frequency response 400 represents the frequency response of the analog front-end circuitry 300 without the low-pass filter formed by $C_{hp}$ and $R_{hp}$. In this configuration, frequency selective analog front-end circuitry 300 operates substantially the same as the conventional single-ended analog front-end circuitry illustrated in FIG. 2A. In some embodiments, the component values of the frequency selective analog front-end circuitry 300 may be selected to provide a frequency response 405 illustrated in FIG. 4. The following table illustrates example parameters for a specific selection of values for $R_{hp}$ and $C_{hp}$.

| | $R_{hp}$ = 200 kΩ $C_{hp}$ = 8 pF |
|---|---|
| $\omega_0$ (kHz) | 201 |
| Q | 1.97 |
| z0 (MHz) | .72 |
| Gain at $\omega_0$ | 17.2 |

For a target touch SNR of 50 dB, use of the frequency selective analog front-end circuitry 300 illustrated in FIG. 3 may reduce power per channel for sense circuitry 120 (FIG. 1) by approximately 40% and reduce chip area per channel by approximately 32% as compared to traditional analog front-end circuitry such as that illustrated in FIGS. 2A and 2B.

Figure 5:
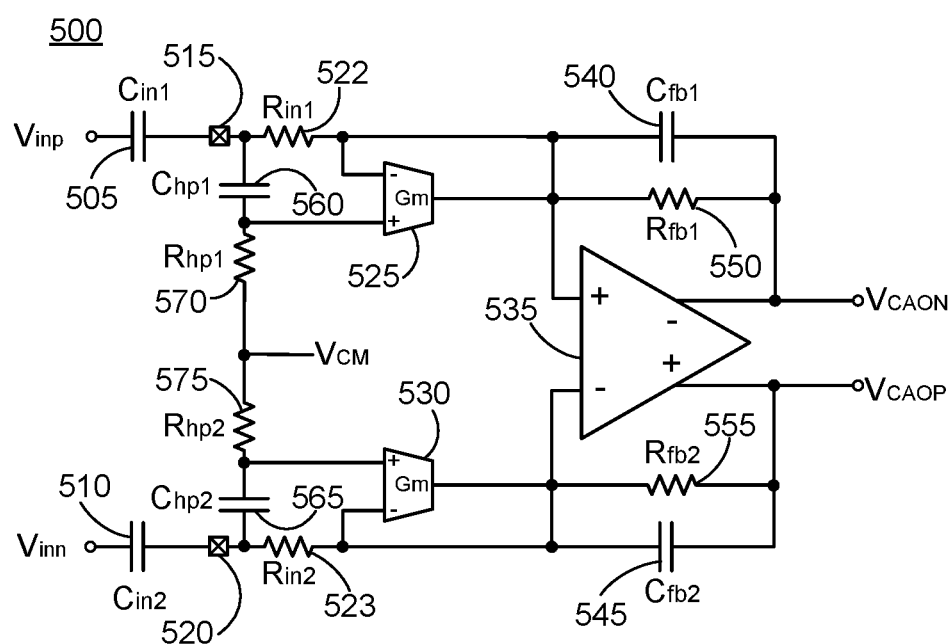
FIG. 5 illustrates frequency selective differential analog front-end circuitry according to an embodiment of the present disclosure.

FIG. 5 illustrates frequency selective differential analog front-end circuitry 500 used to convert the difference between sensed charge signals in an adjacent pair of the sense electrodes 115 to an analog voltage according to an embodiment of the present disclosure. In FIG. 5, $C_{in1}$ 505 and $C_{in2}$ 510 represent the capacitance at the intersections of an adjacent pair of associated sense electrodes 115 and a driven drive electrode 105. Differential Op-amp 535, $R_{in1}$ 522, $R_{in2}$ 523, transconductance amplifiers 525 and 530, $C_{fb1}$ 540, $C_{fb2}$ 545, $R_{fb1}$ 550 and $R_{fb2}$ 555 form a differential charge amplifier to convert the charge difference between $C_{in1}$ 505 and $C_{in2}$ 510 (as measured at terminals 515 and 520) to an analog voltage $V_{CAOP}$-$V_{CAON}$ at the output of differential Op-amp 535. $C_{hp1}$, connected between $C_{in1}$ 505 and the noninverting input of transconductance amplifier 525, $C_{hp2}$, connected between $C_{in2}$ 510 and the noninverting input of transconductance amplifier 530, $R_{hp1}$ 570 connected between the noninverting input of transconductance amplifier 525 and reference voltage $V_{CM}$ and $R_{hp2}$ 575 connected between the noninverting input of transconductance amplifier 530 and reference voltage $V_{CM}$ add a low-pass filter for received charge signals to the differential charge amplifier and may help reduce the effect of common-mode interference. The component values of the frequency selective differential analog front-end circuitry 500 may be selected in a manner similar to that described above with respect to the single-ended frequency selective analog front-end circuitry 300 (FIG. 3) to attenuate common-mode interference above the drive frequency ($f_d$) used for the capacitive touchscreen system 100 (FIG. 1).

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

The invention claimed is:

1. A frequency selective amplifier for converting a charge on a terminal of a first capacitor to a voltage, comprising:
   an op-amp having an output, an inverting input and a noninverting input;
   a first resistor connected between the terminal of the first capacitor and the inverting input of the op-amp;
   a second capacitor connected between the output of the op-amp and the inverting input of the op-amp;
   a second resistor connected between the output of the op-amp and the inverting input of the op-amp;
   a third capacitor connected between the terminal of the first capacitor and the noninverting input of the op-amp; and
   a third resistor connected between the noninverting input of the op-amp and a reference voltage.

2. The frequency selective amplifier of claim 1, wherein the charge on the terminal of the first capacitor has an AC component with a fundamental frequency $f_d$, and wherein values for the first resistor, the second resistor, the second capacitor, the third capacitor and the third resistor are selected for a center frequency $\omega_0$ of the frequency selective amplifier in the range of 1 to 4 times the fundamental frequency $f_d$.

3. The frequency selective amplifier of claim 1, wherein the values for the first resistor, the second resistor, the second capacitor, the third capacitor and the third resistor are selected for a quality factor Q of the frequency selective amplifier in the range of 0.4 to 2.0.

4. A capacitive touchscreen system, comprising:
a plurality of electrically conductive drive electrodes;
a plurality of electrically conductive sense electrodes arranged at an angle with respect to the plurality of drive electrodes;
a dielectric plate positioned between the plurality of drive electrodes and the plurality of sense electrodes such that a mutual capacitance is established at each location where one of the plurality of drive electrodes and one of the plurality of sense electrodes intersects, the mutual capacitances changing in the presence of one or more fingers of a user or touch devices brought into proximity thereto;
drive circuitry operably connected to the plurality of drive electrodes, wherein the drive circuitry applies an AC excitation signal having a fundamental frequency $f_d$ to the plurality of drive electrodes;
frequency selective sense circuitry operably connected to each of the plurality of sense electrodes and configured to sense a charge signal therefrom;
wherein the frequency selective sense circuitry comprises:
an op-amp having an output, an inverting input and a noninverting input;
a first resistor connected between a corresponding sense electrode and the inverting input of the op-amp;
a second capacitor connected between the output of the op-amp and the inverting input of the op-amp;
a second resistor connected between the output of the op-amp and the inverting input of the op-amp;
a third capacitor connected between the corresponding sense electrode and the noninverting input of the op-amp; and
a third resistor connected between the noninverting input of the op-amp and a reference voltage.

5. The capacitive touchscreen system of claim 4, wherein the plurality of sense electrodes are arranged at an angle of approximately 90° with respect to the plurality of drive electrodes.

6. The capacitive touchscreen system of claim 4, wherein the plurality of sense electrodes are arranged at an angle of between 10° and 90° with respect to the plurality of drive electrodes.

7. The capacitive touchscreen system of claim 4, wherein the values for the first resistor, the second resistor, the second capacitor, the third capacitor and the third resistor are selected for a center frequency of the frequency selective sense circuitry in the range of 1 to 4 times the fundamental frequency $f_d$.

8. The capacitive touchscreen system of claim 4, wherein the values for the first resistor, the second resistor, the second capacitor, the third capacitor and the third resistor are selected for a quality factor Q of the frequency selective sense circuitry in the range of 0.4 to 2.0.

9. The capacitive touchscreen system of claim 4, wherein the AC excitation signal is a sine wave.

10. The capacitive touchscreen system of claim 4, wherein the AC excitation signal is a square wave.

11. The capacitive touchscreen system of claim 4, wherein the fundamental frequency $f_d$ of the AC excitation signal is in the range from about 20 kHz to about 500 kHz.

12. A capacitive touchscreen system, comprising:
a plurality of electrically conductive drive electrodes;
a plurality of electrically conductive sense electrodes arranged at an angle with respect to the plurality of drive electrodes;
a dielectric plate positioned between the plurality of drive electrodes and the plurality of sense electrodes such that a mutual capacitance is established at each location where one of the plurality of drive electrodes and one of the plurality of sense electrodes intersects, the mutual capacitances changing in the presence of one or more fingers of a user or touch devices brought into proximity thereto;
drive circuitry operably connected to the plurality of drive electrodes, wherein the drive circuitry applies an AC excitation signal having a fundamental frequency $f_d$ to the plurality of drive electrodes;
frequency selective sense circuitry operably connected to a pair of the plurality of sense electrodes and configured to sense a charge difference signal therefrom;
wherein the frequency selective sense circuitry comprises:
a differential op-amp having an inverting output, a noninverting output, an inverting input and a noninverting input;
a first transconductance amplifier having an output, an inverting input and a noninverting input, wherein the output of the first transconductance amplifier is connected to the noninverting input of the differential op-amp and to the inverting input of the first transconductance amplifier;
a second transconductance amplifier having an output, an inverting input and a noninverting input, wherein the output of the second transconductance amplifier is connected to the inverting input of the differential op-amp and to the inverting input of the second transconductance amplifier;
a first resistor connected between the terminal of the first capacitor and the inverting input of the first transconductance amplifier;
a second resistor connected between the terminal of the second capacitor and the inverting input of the second transconductance amplifier;
a first capacitor connected between the inverting output of the differential op-amp and the noninverting input of the differential op-amp;
a second capacitor connected between the noninverting output of the differential op-amp and the inverting input of the differential op-amp;
a third resistor connected between the inverting output of the differential op-amp and the noninverting input of the differential op-amp;
a fourth resistor connected between the noninverting output of the differential op-amp and the inverting input of the differential op-amp;
a third capacitor connected between the first of the pair of the plurality of sense electrodes and the noninverting input of the first transconductance amplifier;
a fourth capacitor connected between the second of the pair of the plurality of sense electrodes and the noninverting input of the second transconductance amplifier;

a fifth resistor connected between the noninverting input of the first transconductance amplifier and a reference voltage; and a sixth resistor connected between the noninverting input of the second transconductance amplifier and the reference voltage.

13. The capacitive touchscreen system of claim 12, wherein the plurality of sense electrodes are arranged at an angle of approximately 90° with respect to the plurality of drive electrodes.

14. The capacitive touchscreen system of claim 12, wherein the plurality of sense electrodes are arranged at an angle of between 10° and 90° with respect to the plurality of drive electrodes.

15. The capacitive touchscreen system of claim 12, wherein values for the first resistor, the second resistor, the third resistor, the fourth resistor, the fifth resistor, the sixth resistor, the first capacitor, the second capacitor, the third capacitor, and the fourth capacitor are selected for a center frequency $\omega_0$ of the frequency selective sense circuitry in the range of 1 to 4 times the fundamental frequency $f_d$.

16. The capacitive touchscreen system of claim 12, wherein the values for the first resistor, the second resistor, the third resistor, the fourth resistor, the fifth resistor, the sixth resistor, the first capacitor, the second capacitor, the third capacitor, and the fourth capacitor are selected for a quality factor Q of the frequency selective sense circuitry in the range of 0.4 to 2.0.

17. The capacitive touchscreen system of claim 12, wherein the AC excitation signal is a sine wave.

18. The capacitive touchscreen system of claim 12, wherein the AC excitation signal is a square wave.

19. The capacitive touchscreen system of claim 12, wherein the fundamental frequency $f_d$ of the AC excitation signal is in the range from about 20 kHz to about 500 kHz.

20. The capacitive touchscreen system of claim 12, wherein the fundamental frequency $f_d$ of the AC excitation signal is above 1 MHz.

\* \* \* \* \*